US007492442B2

(12) United States Patent
Markoya et al.

(10) Patent No.: US 7,492,442 B2
(45) Date of Patent: Feb. 17, 2009

(54) ADJUSTABLE RESOLUTION INTERFEROMETRIC LITHOGRAPHY SYSTEM

(75) Inventors: Louis Markoya, Sandy Hook, CT (US); Aleksandr Khmelichek, Brooklyn, NY (US); Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 386 days.

(21) Appl. No.: 10/927,309

(22) Filed: Aug. 27, 2004

(65) Prior Publication Data

US 2006/0044539 A1    Mar. 2, 2006

(51) Int. Cl.
*G03B 27/54* (2006.01)
*G03B 27/52* (2006.01)

(52) U.S. Cl. .......................... 355/67; 355/55
(58) Field of Classification Search ................ 355/53, 355/67, 55; 385/37; 356/511
See application file for complete search history.

(56) References Cited

U.S. PATENT DOCUMENTS

| | | | | | |
|---|---|---|---|---|---|
| 5,450,199 | A | * | 9/1995 | Rieder | 356/499 |
| 5,757,493 | A | * | 5/1998 | VanKerkhove | 356/511 |
| 5,796,477 | A | | 8/1998 | Teich | |
| 5,837,169 | A | * | 11/1998 | Rourke | 264/1.27 |
| 6,178,000 | B1 | | 1/2001 | Hoffnagle | |
| 6,411,367 | B1 | * | 6/2002 | Baker et al. | 355/67 |
| 6,627,356 | B2 | * | 9/2003 | Kawamura et al. | 430/5 |
| 6,823,113 | B2 | * | 11/2004 | Lu et al. | 385/37 |
| 2001/0010579 | A1 | * | 8/2001 | Nishi | 355/67 |
| 2001/0043522 | A1 | | 11/2001 | Park | |
| 2001/0053608 | A1 | | 12/2001 | Williams et al. | |
| 2002/0149751 | A1 | | 10/2002 | Bloomstein et al. | |
| 2005/0057735 | A1 | * | 3/2005 | Smith | 355/55 |

(Continued)

FOREIGN PATENT DOCUMENTS

EP    0 303 836 A    2/1989

(Continued)

OTHER PUBLICATIONS

Smith, Bruce W. et al. "Approaching the numerical aperture of water—Immersion lithography at 193nm", *Proc. of SPIE*, vol. 5377, 2004, pp. 273-284.

(Continued)

*Primary Examiner*—Peter B Kim
(74) *Attorney, Agent, or Firm*—Pillsbury Winthrop Shaw Pittman LLP

(57) ABSTRACT

A lithographic system includes a laser outputting a laser beam; a beamsplitter dividing the laser beam into a plurality of beams; and a prism for forming interference fringes on a substrate using the plurality of beams. Resolution of the lithographic system is adjustable without replacing any optical components in an optical path of the lithographic system. The beamsplitter is movable along the optical path to adjust the resolution. The prism includes a plurality of sets of facets, each set of facets corresponding to a particular resolution. Each set of facets corresponds to a particular beamsplitter position along the optical path, and/or to a particular resolution. The beamsplitter includes a linear grating or a checkerboard grating. The beams are N-way symmetric. The resolution is adjustable. A numerical aperture of the system is adjustable by moving the beamsplitter along the optical path. A liquid can be between the substrate and the prism.

15 Claims, 2 Drawing Sheets

U.S. PATENT DOCUMENTS

2007/0070321 A1    3/2007    Markoya et al.

FOREIGN PATENT DOCUMENTS

| | | |
|---|---|---|
| JP | 61-090185 A | 5/1986 |
| JP | 06-097600 A | 4/1994 |
| JP | 07-159609 A | 6/1995 |
| JP | 09-153446 A | 6/1997 |
| JP | 2004-219423 A | 8/2004 |
| WO | WO 2004/010222 | 1/2004 |

OTHER PUBLICATIONS

European Search Report for European Application No. 05018429.0-1226, dated Dec. 27, 2007, 8 pages.

English translation of Notice of Reasons for Rejection for Japanese Patent Application No. 2005-246663, dated Sep. 22, 2008.

* cited by examiner

ADJUSTABLE RESOLUTION INTERFEROMETRIC LITHOGRAPHY SYSTEM

BACKGROUND OF THE INVENTION

1. Field of the Invention

The present invention relates to lithographic systems, and more particularly to interferometric lithographic systems with adjustable resolution.

2. Related Art

In interferometric lithographic systems, a laser beam is sent into a beam splitter, the beam splitter divides the laser beam, and then the laser beam is recombined at a substrate that is being exposed, to form a pattern. Typically the patterns being formed involve lines, or rulings, which are used to test such components as photoresist, etc.

Thus, in an interferometric lithographic system, two laser beams are coherently matched, to form fringes at the substrate plane. The fringe pattern exposes the photoresist, which forms a type of a grating pattern. Different interferometric lithographic systems have different ways of generating the two laser beams that will ultimately produce the interference fringes at the substrate.

In conventional interferometric lithographic systems, in order to change the resolution of the system, it is generally necessary to change a number of parameters of the optical system. Typically, this involves replacing some elements of the optics modules. This procedure can be time consuming. Additionally, replacing optical elements or components frequently requires realignment of the components, further increasing the time that the procedure requires.

For example, one of the parameters that needs to change in order to change the resolution of the system is the angle at which the laser beams strike the substrate. This may be viewed as analogous to changing the numerical aperture of the optical system (although, since lenses are not involved in formation of the image in interferometric systems, the numerical aperture at issue is more of a derivative concept).

Other parameters that may need to be changed involve how the beams are separated, and the alignment of various optical components needed to produce the interference fringes. Because of the relatively small coherence length of the laser, there is generally little room for the optical designer to work with, in making sure that the two laser beams actually form the required fringes. In other words, the alignments have to be exact, which is often very difficult to achieve in practical systems, particularly where optical components have to be swapped in and out of the system.

Having changeable optical elements drives the system complexity and cost upward. Each time a user has to change a beam splitter or a optical module, there is risk of losing critical alignments.

Accordingly, there is a need in the art for a system with adjustable resolution and without the alignment complexities of the conventional interferometric lithographic systems.

SUMMARY OF THE INVENTION

The present invention relates to an adjustable resolution interferometric lithography system that substantially obviates one or more of the disadvantages of the related art.

More particularly, in an exemplary embodiment of the present invention, a lithographic system includes a laser outputting a laser beam; a beamsplitter dividing the laser beam into a plurality of beams; and a prism for forming interference fringes on a substrate using the plurality of beams. Resolution of the lithographic system is adjustable without replacing any optical components in an optical path of the lithographic system. The beamsplitter is movable along the optical path to adjust the resolution. The prism includes a plurality of sets of facets, each set of facets corresponding to a particular resolution. Each set of facets corresponds to a particular beamsplitter position along the optical path, and/or to a particular resolution. The beamsplitter comprises a linear grating or a checkerboard grating. The beams are two-way symmetric, four-way symmetric, or N-way symmetric. The resolution is adjustable to any of, for example, 90 nm, 65 nm, 45 nm and 35 nm. A numerical aperture of the system is adjustable by moving the beamsplitter along the optical path. The laser beam includes any of 193 nm light, 248 nm light, and 157 nm light. A liquid can be between the substrate and the prism.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
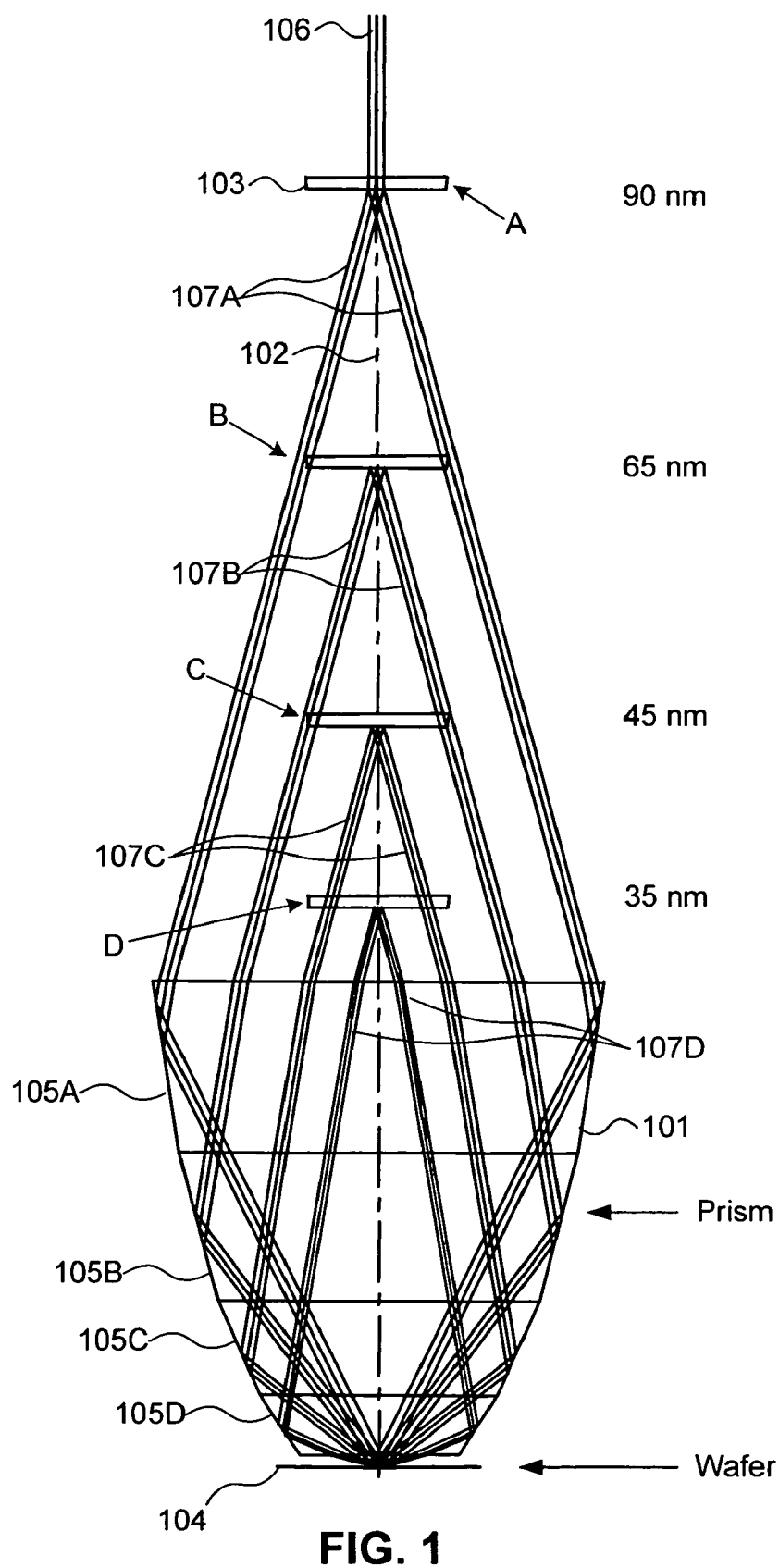
FIG. 1 shows an exemplary interferometric lithographic system of the present invention.

In one embodiment, the present invention achieves variable resolution of an interferometric lithographic system through the use of a multifaceted pyramidal prism and a movable beam splitter, such as shown in, for example, FIG. 1. As shown in FIG. 1, a prism 101 is mounted in an optical path that has an optical axis 102. The optical axis 102 may be thought of as the Z axis of the system. A beam splitter 103 is positioned further upstream in the optical path. The prism 101 is mounted above a wafer (or substrate) 104, and usually a liquid (not shown in the figure) is circulated between the prism 101 and the wafer 104, if the system is an immersion lithographic system. It should be noted that the present invention is not limited to immersion lithographic systems, but may also be used with air or other gas between the prism 101 and the wafer 104.

Also shown in FIG. 1 is a laser beam 106, which is split by the beam splitter 103 into two or more beams. Shown in FIG. 1 is the case of two-way symmetry, in other words, the beam 106 is split into two beams, for example, when the beam splitter 103 is in position A, the beam 106 is split into two beams 107A. When the beam splitter is in position B, the laser beam 106 is split into two beams 107B, and so forth. The beams 107A-107D, upon traversing the beam splitter 103 (in whichever position A-D it is located), then enter the prism 101, and internally reflect off of one of the surfaces 105A-105D. The beams then form interference fringes on the wafer 104.

The beam splitter 103 is movable in the Z axis, for example, by being mounted on a Z axis stage (not shown). Each position of the beam splitter 103 (positions A-D) correspond to the beams being reflected off of the appropriate facet 105 of the prism 101. Note that although four positions of the beam splitter 103 are shown in FIG. 1, corresponding to resolutions of 90 nm, 65 nm, 45 nm and 35 nm, for a 193 nm input laser beam 106, the invention is not limited to these particular resolutions, or to that particular laser beam wavelength. Other wavelengths are possible, such as 365 nm, 248 nm or 157 nm. Also, more or fewer prism facets 105 may be used, to correspond to more or fewer Z axis positions of the beam splitter 103. Actual resolution is defined by beamsplitter 103 angle position, and prism facet 105 angle.

Note further that to improve resolution, generally the wavelength of the laser beam 106 needs to be decreased. Additionally, the index of refraction of the fluid between the wafer 104 and the prism 101 may be changed. Water has an index of refraction of approximately 1.43 (at 193 nm), but other media can have higher index of refraction, thereby allowing to improve the resolution further. Moreover, salts or the like can be added to the water, to increase its index of refraction further.

Although the embodiment shown in FIG. 1 is an example of a two-way symmetric system, the invention is not limited to this embodiment. For example, a four-way symmetric lithographic system can also be designed, with the prism 101 having a square cross section (when viewed upwards into the prism 101), and the beam splitter 106 generating four laser beams that collectively form an interference pattern on the wafer 104.

Any number of beam splitters may be used as a beam splitter 103. The most common type of beam splitter in this application is a grating. Typical pitch of the grating in this case is approximately 0.5-2 microns, although the invention is not limited to any particular grating dimension.

The advantage of using a prism such as shown in FIG. 1 is that there are no alignment difficulties, once the prism 101 is manufactured. Upon placement of the prism 101 in the optical system, the only adjustment is the Z axis adjustment of the beam splitter 103, which is a relatively straightforward operation, if the beam splitter 103 is placed on a Z axis stage.

The prism 101 may be generalized to have N-way symmetry. For example, there may be circumstances when a six-way symmetric interferometric lithographic system may be used. Note also that the number N need not be an even number, in other words, three-way, or five-way symmetries are also possible (corresponding to triangular, or pentagonal cross-sections of the prism 101).

Typical dimensions of the prism 101 is approximately 100 millimeters long by about 25 millimeters at the bottom face, by about 50 millimeters at the top face, although it will be understood that the invention is not limited to these particular dimensions. Generally, the exact dimensions of the prism, the pitch of the grating of the beam splitter 103, and the dimensions and orientations of the prism facets 105 depend on the resolution desired, the laser beam wavelength, the index of refraction of the medium between the prism 101, distances between components and the wafer 104, and other alignment issues.

It will also be appreciated that the present invention allows the adjustment of both the resolution and the equivalent numerical aperture. In many (though not in all) circumstances, these adjustments are dependent upon each other, although there may be circumstances where the equivalent numerical aperture and the resolution may be independently adjustable.

Figure 2:
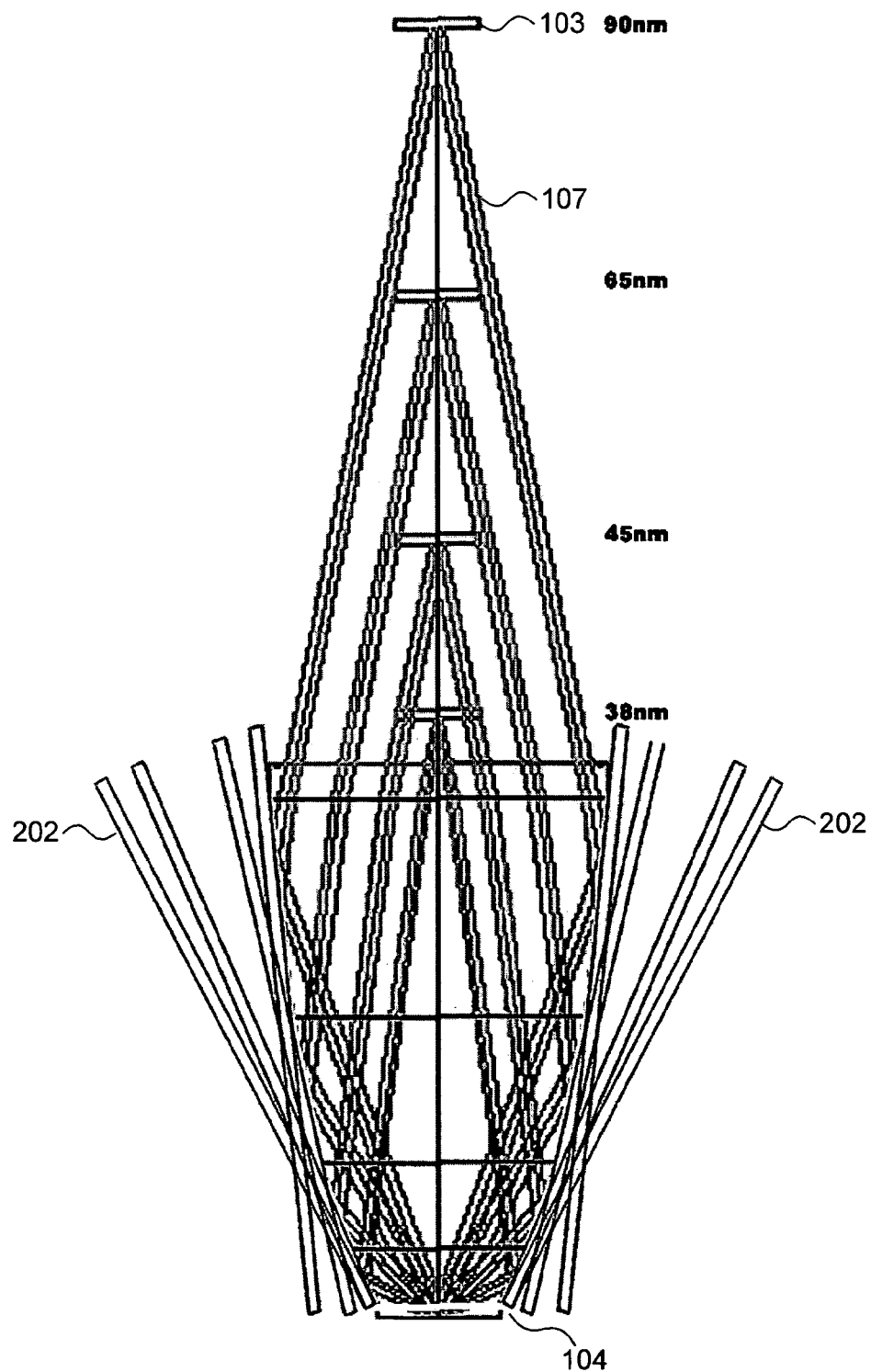
FIG. 2 illustrates an alternative embodiment of the present invention, where mirrors are used.

FIG. 2 illustrates an alternative embodiment of the present invention, where mirrors 202 are used instead of the prism 101. The mirrors 202 may be either swapped in and out for different beam splitter 103 positions, or may be rotated and moved to adjust the angles. The effect of the mirrors 202 is essentially the same as the effect of the prism facets 105 in FIG. 1. It is currently believed by the inventors that the use of the mirrors 202, such as shown in FIG. 2, is more difficult, since it requires a considerably greater number of independent alignment adjustments.

In particular, with reference to FIG. 2, the path length of each diffracted beam relative to every other diffracted beam has to be precisely matched. This makes the adjustment of the mirrors 202 in both the angular degree of freedom and the spatial degrees of freedom very critical.

At present, it is believed that for a 193 nm laser beam, the optical system such as shown in FIG. 1 has a resolution limit of approximately 34 nanometers (using water as an immersion medium). The primary limiting factor is the internal reflection angle within the prism 101 (at the bottom face), and the angles that can be achieved. Generally, to improve the resolution further, immersion media with a higher index of refraction needs to be used, or a laser beam with a smaller wavelength, or both. With those factors in mind, it is believed that a resolution of about 20 nanometers may be achieved with this approach.

The grating is typically a chrome-on-glass type grating, although the invention is not limited to this particular type of grating, or to the use of a grating generally. For example, a phase shifted etched glass beam splitter may be used. To generate a four-way symmetric set of beams, a checkerboard type grating needs to be used.

Note that the dimensions shown in the figure (90 nm, 65 nm, 45 nm and 35 nm) refer to the smallest feature size that can be imaged on the substrate 104, but the invention is not limited to specific dimensions.

The resolution is therefore changed by moving the upper unit beam splitter 103 in the Z-axis so that the beams 107 reflect off the required prism facet 105 in the prism 101. The resolution is controlled primarily by the angle on the final interfering beams, and hence by the facet angle on the reflecting surface in the prism 101. In the design shown in FIG. 1, there are four preset resolutions: 90 nm, 65 nm, 45 nm, and 38 nm. These resolutions can be changed by replacing the multi-faceted prism 101 with a different one with different predefined facet angles. Change in resolution can be made under computer control by driving a motorized Z-axis with the beam splitter 103. The design is flexible in terms of the number of different facet angles that can be predefined. In the example shown there are four sets of facets (105A-105D). The facets 105A-105D can be based on two-fold, for-fold, or even six-fold symmetry. The actual symmetry requirement is defined by the beam splitter 103 design.

The totally reflecting facets 105 can be coated with thin films so that the final reflected wafer polarization is the same as the incident/input polarization, or to generate any preferred polarization state. Likewise, other surfaces could be coated to preserve desired polarization states.

Utilizing the design described herein allows for the least complex optical path, cuts costs, maintains alignment with resolution changes, and allows computer control of resolution.

Having thus described a preferred embodiment of a system and method, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:

1. A lithographic system comprising:
   a beamsplitter to divide a laser beam into a plurality of beams; and
   a prism to form interference fringes on a substrate using the plurality of beams,
   wherein the prism comprises a plurality of sets of facets disposed along an optical axis of the lithographic system at predefined positions, each set of facets reflecting the plurality of beams corresponding to a particular beamsplitter position along the optical axis, and
   wherein resolution of the lithographic system is capable of being adjusted by changing a relative position between the prism and the beamsplitter.

2. The system of claim 1, wherein the beamsplitter is movable along the optical axis to adjust the resolution.

3. The system of claim 1, wherein each set of facets corresponds to a particular resolution.

4. The system of claim 1, wherein the beamsplitter comprises a linear grating.

5. The system of claim 1, wherein the beamsplitter comprises a checkerboard grating.

6. The system of claim 1, wherein the plurality of beams are two-way symmetric.

7. The system of claim 1, wherein the plurality of beams are four-way symmetric.

8. The system of claim 1, wherein the plurality of beams are N-way symmetric.

9. The system of claim 1, wherein the resolution is adjustable to any of 90 nm, 65 nm, 45 nm or 35 nm.

10. The system of claim 1, wherein a numerical aperture of the system is adjustable by moving the beamsplitter along the optical axis.

11. The system of claim 1, further comprising a laser to output the laser beam, wherein the laser beam comprises any of 193 nm radiation, 248 nm radiation, or 157 nm radiation.

12. The system of claim 1, further comprising a liquid between the substrate and the prism.

13. A lithographic system comprising:
   a beamsplitter movable along an optical axis of the lithographic system to adjust resolution of the lithographic system, wherein at each position along the optical axis, the beamsplitter is configured to divide a laser beam into a corresponding plurality of beams; and
   a prism configured to form interference fringes on a substrate using the plurality of beams, wherein the prism comprises a plurality of sets of facets with predefined facet angles disposed along the optical axis, each set of facets reflecting the plurality of beams corresponding to a particular beamsplitter position along the optical axis.

14. A lithographic system comprising:
   a beamsplitter movable along an optical axis of the lithographic system to adjust resolution of the lithographic system, wherein at each position along the optical axis, the beamsplitter is configured to divide a laser beam into a corresponding 4-way symmetric beam; and
   a prism configured to form interference fringes on a substrate using the 4-way symmetric beam, wherein the prism comprises a plurality of sets of facets with predefined facet angles disposed along the optical axis, each set of facets reflecting the 4-way symmetric beam corresponding to a particular beamsplitter position along the optical axis.

15. A lithographic system comprising:
   a beamsplitter to divide a laser beam into a plurality of beams; and
   a prism to form interference fringes on a substrate using the plurality of beams,
   wherein the prism comprises a plurality of sets of predefined facets disposed along an optical axis, each set of facets reflecting the plurality of beams when the beamsplitter is located at a particular relative position along the optical axis, and
   wherein equivalent numerical aperture of the lithographic system is capable of being adjusted by changing a relative position between the prism and the beamsplitter along the optical axis of the lithographic system.

* * * * *